(12) United States Patent
Ngo et al.

(10) Patent No.: US 6,872,991 B1
(45) Date of Patent: Mar. 29, 2005

(54) LOW GATE-LEAKAGE VIRTUAL RAIL CIRCUIT

(75) Inventors: Hung C. Ngo, Austin, TX (US); Jente B. Kuang, Austin, TX (US); Kevin J. Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/840,708

(22) Filed: May 6, 2004

(51) Int. Cl.[7] .................. H01L 27/10; H01L 29/76; H01L 29/94; H01L 31/062; H01L 31/113

(52) U.S. Cl. .................. 257/207; 257/208; 257/369; 257/394

(58) Field of Search .................. 257/207, 208, 257/369, 394

(56) References Cited

U.S. PATENT DOCUMENTS 6,400,540 B1 * 6/2002 Chang .................. 361/56
6,653,751 B1 * 11/2003 Teh Lo .................. 307/125
6,657,836 B2 * 12/2003 He et al. .................. 361/56
2003/0201457 A1 * 10/2003 Lin et al. .................. 257/173

* cited by examiner

Primary Examiner—Ngân V. Ngô
(74) Attorney, Agent, or Firm—Richard F. Frankeny; Winstead Sechrest & Minick P.C.; Casimer K. Salys

(57) ABSTRACT

Circuits within a logic domain use partitioned power supply buses. Selected of the power supply buses are coupled to the power supply voltage potentials with electronic switches with gradated conductivity and leakage current. When the circuits are actively switching during a logic operation, the power supply voltage potentials are coupled to the buses with maximum conductivity. At predetermined times later, selected of the electronic switches are switched OFF to reduce leakage current. Lower conductivity and thus lower leakage switches remain ON to ensure corresponding logic states are maintained during a controlled low leakage time period. Various logic configurations are used to switch OFF high leakage devices.

28 Claims, 13 Drawing Sheets

LOW GATE-LEAKAGE VIRTUAL RAIL CIRCUIT

CROSS-REFERENCE TO RELATED APPLICATIONS

The present invention is related to U.S. patent application Ser. No. 10/821,047, filed Apr. 8, 2004, entitled "AN INTERFACE CIRCUIT FOR COUPLING BETWEEN LOGIC CIRCUIT DOMAINS,"

U.S. patent application Ser. No. 10/821,048, filed Apr. 8, 2004, entitled "BUFFER/DRIVER CIRCUITS," and U.S. patent application Ser. No. 10/835,501, filed Apr. 29, 2004, entitled "SELF LIMITING GATE LEAKAGE DRIVER," which are incorporated by reference herein.

GOVERNMENT RIGHTS

This invention was made with Government support under NBCH30390004 awarded by DEFENSE ADVANCED RESEARCH PROJECT AGENCY. The Government has certain rights in this invention.

TECHNICAL FIELD

The present invention relates in general to complementary metal oxide semiconductor (CMOS) circuits and, in particular, to circuit methodologies for reducing leakage in sub-100 nm technologies.

BACKGROUND INFORMATION

Oxide tunneling current in metal oxide silicon (MOS) field effect transistors (FET) is a non-negligible component of power consumption as gate oxides get thinner, and may in the future become the dominant leakage mechanism in sub-100 nm complementary MOS (CMOS) circuits. The gate current is dependent on various conditions for a single transistor and three main static regions of operation may be identified for a MOSFET. The amount of gate-leakage current differs; by several orders of magnitude from one region to another. Whether a transistor leaks significantly or not is also affected by its position in relation to other transistors within a CMOS circuit structure as this affects the voltage stress to which a particular device is subjected.

The three regions of operation are a function of applied bias if one only considers the parameters that affect the magnitude of gate current in a MOSFET as it operates in relation to other MOSFETs. Assuming that the supply voltage (Vdd) and the threshold voltage (Vt) are fixed, then a MOSFET in a static CMOS logic gate operates in one to the three regions, each with a significantly different amount of gate leakage.

The first region is called "strong inversion" and is the region where a MOSFET operates with the absolute value of the gate to source voltage (|VGS|) equal to Vdd. The gate-leakage current density for an N-channel FET (NFET) in strong inversion may be as high as 103 amperes square centimeter ($A/cm^2$) for an oxide thickness of 1.5 nanometers (nm) at Vdd equal to 3 volts (V). For such a thin oxide, a more realistic value for Vdd is 1.2 V, in which case the gate-leakage current would more likely be 20 $A/cm^2$.

The second region is called the "threshold" region where |VGS|=Vt. A MOSFET operating in the threshold region will leak significantly less than one operating in the strong inversion region, typically 3 to 6 orders of magnitude less depending on Vdd and the oxide thickness.

The third region is called the "Off" region where |VGS|= 0.0 V. For an NFET operating in the Off region, there is no leakage if the drain voltage (Vd)=0.0 V. However, if Vd is equal to Vdd, then a small leakage current in the reverse direction (drain to gate) may be present due to gate-drain overlap area. Of course this current depends on transistor geometry and is typically 10 orders of magnitude less than the gate-leakage current in the strong inversion region.

The above three regions represent three distinct conditions or states for the channel of a MOSFET. Whether an "ON" transistor operates at strong inversion or at threshold is determined by its position inside a logic circuit structure as well as by the state of other transistors in the circuit structure.

Both NFETs and P-channel FETs (PFETs) in a logic circuit structure operate in one of the three regions described above. However, the main tunneling current in a PFET device in strong inversion is due to hole tunneling from the valence band and the main tunneling current in an NFET device in strong inversion is due to electron tunneling from the conduction band. Because of this, PFET gate currents are about 10 times smaller than equivalent sized NFET devices. This fact is important in assessing gate-leakage in a static CMOS circuit.

Since gate leakage currents are measured as current density, it follows that the gate-leakage current in a MOSFET is directly proportional to the gate area (width times length). Transistor sizing, therefore, has a direct impact on the amount of gate-leakage in a CMOS logic circuit.

As CMOS circuits become smaller, leakage current that results when voltage is applied to the gate of the field effect transistors becomes a significant portion of the power dissipation. Leakage power may become the limiting factor in how small devices may be manufactured. As devices are made smaller, the power supply voltage is correspondingly reduced. However, this may not achieve an adequate reduction in leakage power dissipation. Alternate techniques are being employed to reduce leakage power. One popular technique is to use power-gating to isolate the power supply voltage in groups of circuits at controlled times. These circuits are sometimes referred to as being part of a power-gated domain. Other circuits may be evaluating a logic function and may not be in a power-gated domain. Interfacing between circuits in a power-gated domain and circuits in a non-power-gated domain may prove difficult. The state of an output from a power-gated domain may be uncertain during the time period of power-gating. While the benefits of power-gating are known, there is no consensus on strategies to preserve logic states of outputs in the power-gated domains. Since power-gated domains may be variable, the method of preserving output logic states from circuits in a power-gated domain are controlled by the power-gating control signals themselves.

The current drive capability of a CMOS buffer depends on the channel size of devices used to drive outputs or to drive many other logic gate inputs. Therefore, one would expect the large devices to exhibit large gate-leakage current when the technology has gate oxides that are very thin. Likewise, logic regions with a high number of logic gates may exhibit a large gate-leakage current due to the large number of devices that are in strong inversion at any one static time (between clock transitions). Logic regions with a high number of logic gates may employ power supply gating whereby the power to the logic devices are decoupled by the action MOSFETs, PFETs for the positive power supply voltage and NFETs for the negative power supply voltage. These regions where power supply gating is employed is sometimes referred to as "cuttable" regions. When a cuttable region is interfaced with a non-cuttable region, then logic states at the interface outputs may become indeterminate when power is decoupled.

There is, therefore, a need for a circuit design for low leakage circuits that enables circuitry to be selectively coupled to the power supply rails to reduce gate leakage current.

SUMMARY OF THE INVENTION

Logic circuits are partitioned into domains with power gating and non-power gating. The power gated domains have the power supply buses partitioned and coupled to the power supply voltage potentials using multiple power gating FET switches. One power gating FET has its gate node controlled by a standard inverting logic circuit receiving an activate power signal wherein power is coupled to a power bus in response to a first logic state of the activate power signal and de-coupled in response to the second logic state of the activate power signal. Another power gating FET is controlled by a cut-inverter wherein one logic state of the cut-inverter is floated in response to a cut-power signal such that the leakage stress of the power gating FET is reduced by allowing its gate to float. Embodiments of the present invention allow the activate power signal and the cut-power signal to be independently controlled. Other embodiments allow the activate power signal and the cut-power signal to be generated by various logic combinations of control signals.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
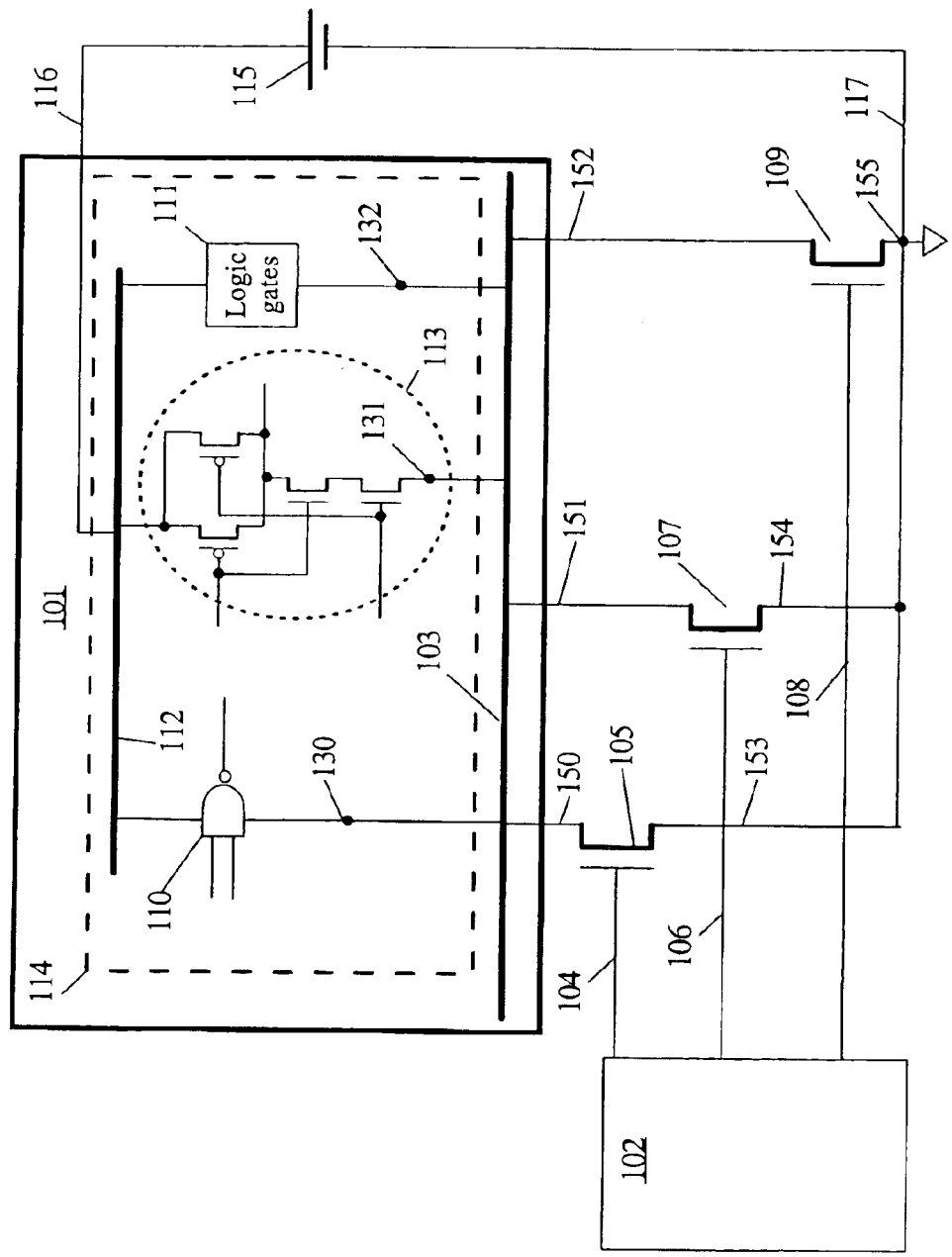
FIG. 1 is a circuit block diagram illustrating a basic topology of embodiments of the present invention with low rail power gating.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

In the following, power supply voltage potentials are distributed to circuits on circuit traces or printed wires which may be referred to interchangeably as power supply rails, grids or buses. Power supply voltage potentials are coupled to the buses or grids to activate various logic circuitry. The power supply voltage potentials may be referred to simply as positive potential or ground potential. The "voltage" term may be dropped for simplicity with the understanding that all the potentials are voltage potentials.

Refer now to the drawings wherein depicted elements are not necessarily shown to scale and wherein like or similar elements are designated by the same reference numeral through the several views.

FIG. 1 is a block circuit diagram of power gating according to embodiments of the present invention. A logic circuit domain 101 has a virtual low (ground) power supply rail or bus (VGR) 103 that is coupled to the ground nodes 130–132 of selected circuits 110, 111, and 113 in domain 101. Logic circuit 113 illustrates the FETs making up its logic function. Power supply 115 has positive voltage potential 116 coupled directly to bus 112 and ground voltage potential 117. The VGR 103 is selectively coupled to the power supply ground voltage potential 117 with parallel N channel field effect transistor (NFET) devices 105, 107, and 109 operating as electronic switches. NFETs 105, 107, and 109 have nodes 150–152, respectively, coupled to VGR 103 and nodes 153–154, respectively, coupled to ground voltage potential 117. The NFETs 105, 107, and 109 are controlled by logic signals 104, 106, and 108, respectively. Logic signals 104, 106, and 108 are generated in logic domain 102 with non power gated circuitry. In this manner, VGR 103 may be coupled to ground potential 117 with various degrees of conductivity. Large devices have higher conductivity but generally display higher leakage. Smaller devices have lower conductivity but display lower leakage. In this manner, some or all of NFETs 105, 107, and 109 may be gated ON when there is a high degree of switching in domain 101 requiring speed in arriving at a logic output in response to logic inputs. Once an output is determined in domain 101, selective ones of NFETs 105, 107, and 109 may be gated OFF thus reducing leakage power.

Figure 2:
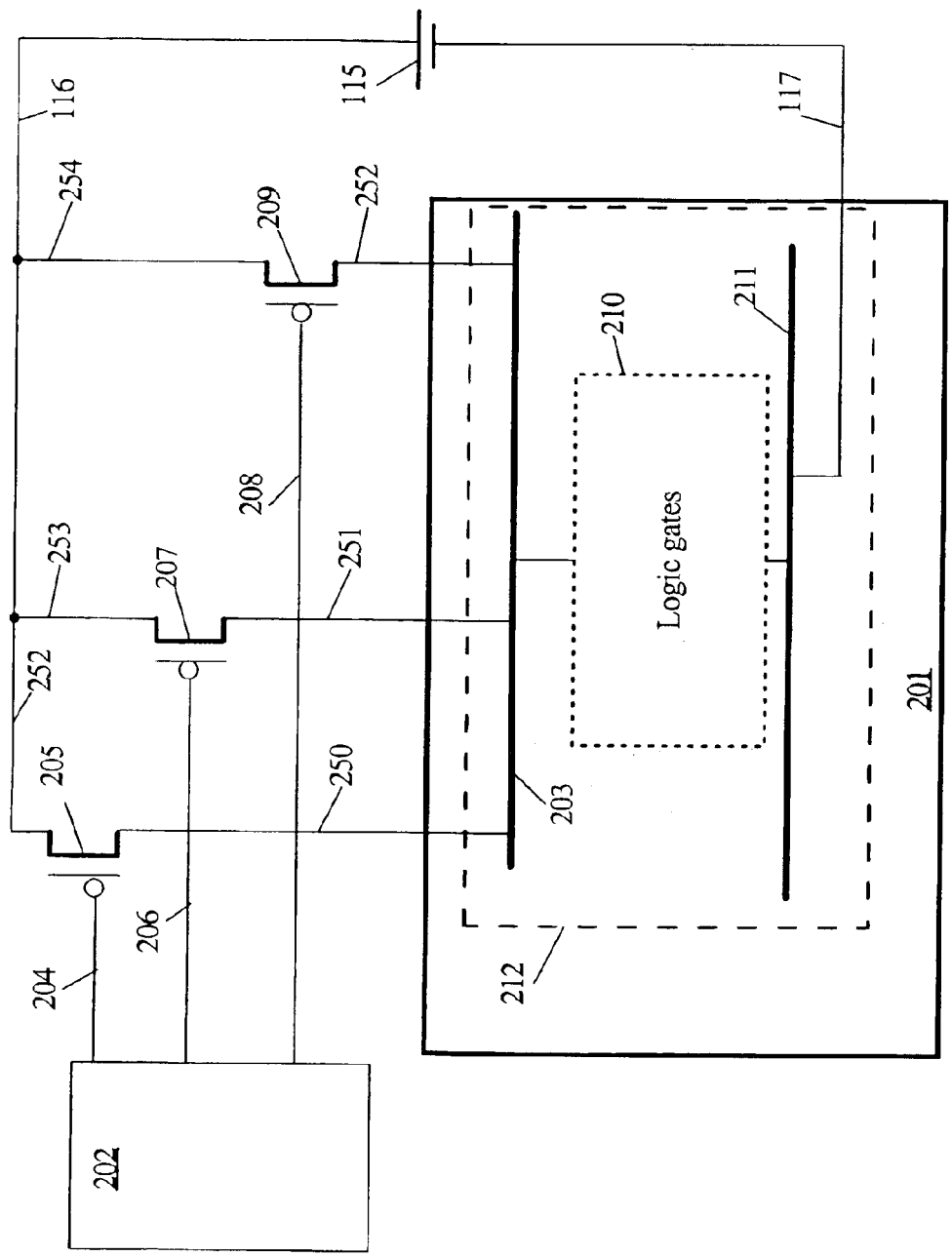
FIG. 2 is a circuit block diagram illustrating a basic topology of embodiments of the present invention with high rail power gating.

FIG. 2 is a block circuit diagram of power gating according to embodiments of the present invention. A logic circuit domain 201 has a virtual high (positive) power supply rail or bus (VPR) 203 that is coupled to a positive power bus in selected circuits 210. Power bus 211 of logic gates 210 is coupled directly to ground potential 117 of power supply 115. VPR 203 is coupled to the positive potential 116 of power supply with parallel P channel field effect transistor (PFET) devices 205, 207, and 209 operating as electronic switches. PFETs 205, 207, and 209 have nodes 252–254, respectively, coupled to positive voltage potential 116 and nodes 250–251, respectively, coupled to VPR 203. The PFETs 205, 207, and 209 are gated by logic signals 204, 206, and 208, respectively. Logic signals 204, 206, and 208 are generated in logic domain 202 with non-power gated circuitry. In this manner, VPR 203 may be coupled to the positive potential 116 with various degrees of conductivity. Large devices have higher conductivity but display higher leakage. Smaller devices have lower conductivity but display lower leakage. Some or all of PFETs 205, 207, and 209 may be gated ON when there is a high degree of switching in domain 201 requiring speed in arriving at a logic output in response to logic inputs. Once an output is determined in domain 201, selective ones of PFETs 205, 207, and 209 may be gated OFF thus reducing leakage power.

FIGS. 1 and 2 show partitioned power gating applied to only one power supply potential at a time, however, it is understood that embodiments of the present invention may employ partitioned power gating simultaneously to both power supply potentials for logic circuits in a logic domain (e.g., domain 201).

The following FIGS. 3–12 typically show embodiments of the present invention applied to one power supply bus at a time for simplicity. Likewise, NFETs and PFETs are used as electronic switches to couple power supply potentials to virtual power buses. These NFETs and PFETs have nodes that may not have specific designators as used in FIGS. 1 and 2 for simplicity of the drawings.

Figure 3:
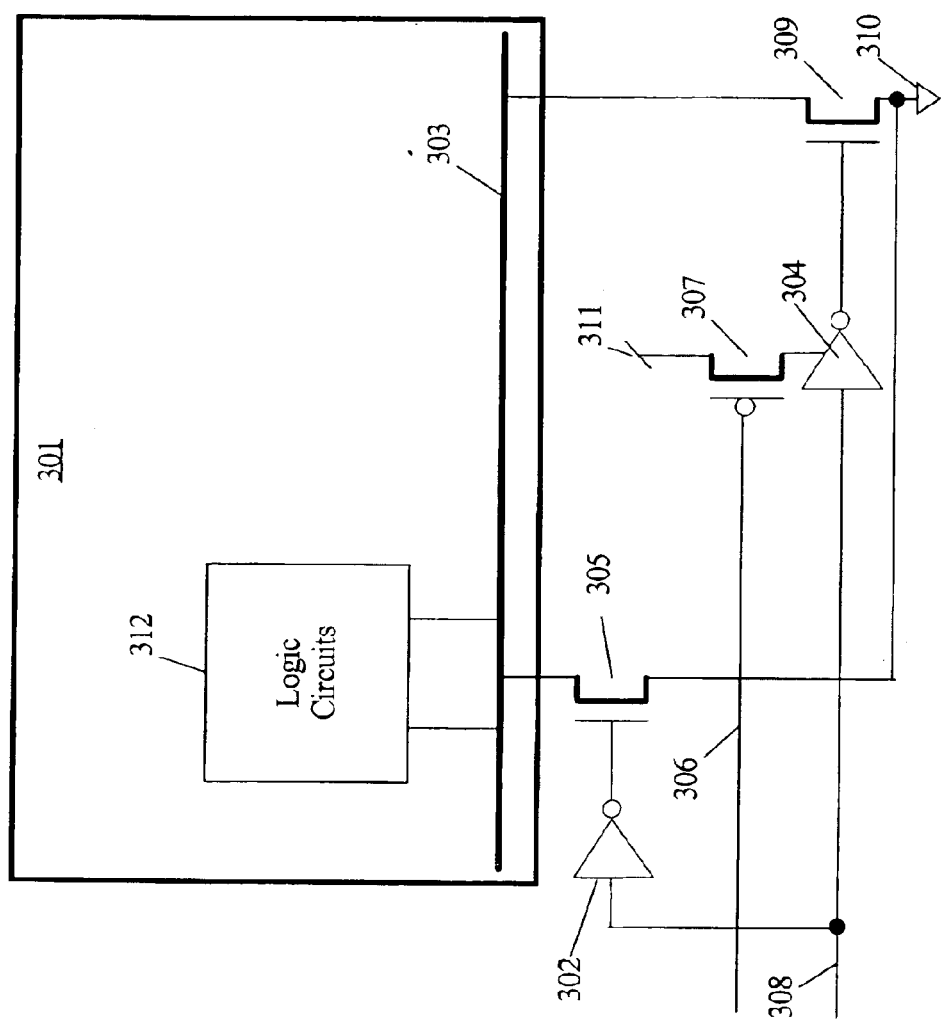
FIG. 3 is a circuit block diagram illustrating a basic topology of embodiments of the present invention adding stress gating on the low rail.

FIG. 3 is a block circuit diagram of power gating with stress relief on power gating devices to further reduce leakage according to embodiments of the present invention. When control signal 308 is a logic zero, both NFET 305 and NFET 309 are turned ON via inverter 302 and power-gated inverter 304, respectively, thereby coupling actual power supply ground 310 to VGR 303 coupled to logic circuits 312. When control signal 308 is a logic one, both NFET 305 and NFET 309 are gated OFF. The circuit topology of FIG. 3 allows an additional level of control with control signal 306. Inverter 304 turns ON NFET 309 by providing a logic one level from positive power supply potential 311 via PFET 307. When NFET 309 is ON, both its gate-to-drain and its gate-to-source experience maximum voltage potential and thus NFET 309 is in strong inversion with the highest leakage. However, if NFET 309 is turned ON to give VGR 303 its maximum conductivity connection to low power rail 310, it may be "stress" relieved by gating OFF PFET 307 with a logic one on control signal 306. This causes the gate of NFET 309 to "float" and ultimately discharge to ground reducing the leakage of NFET 309.

Figure 4:
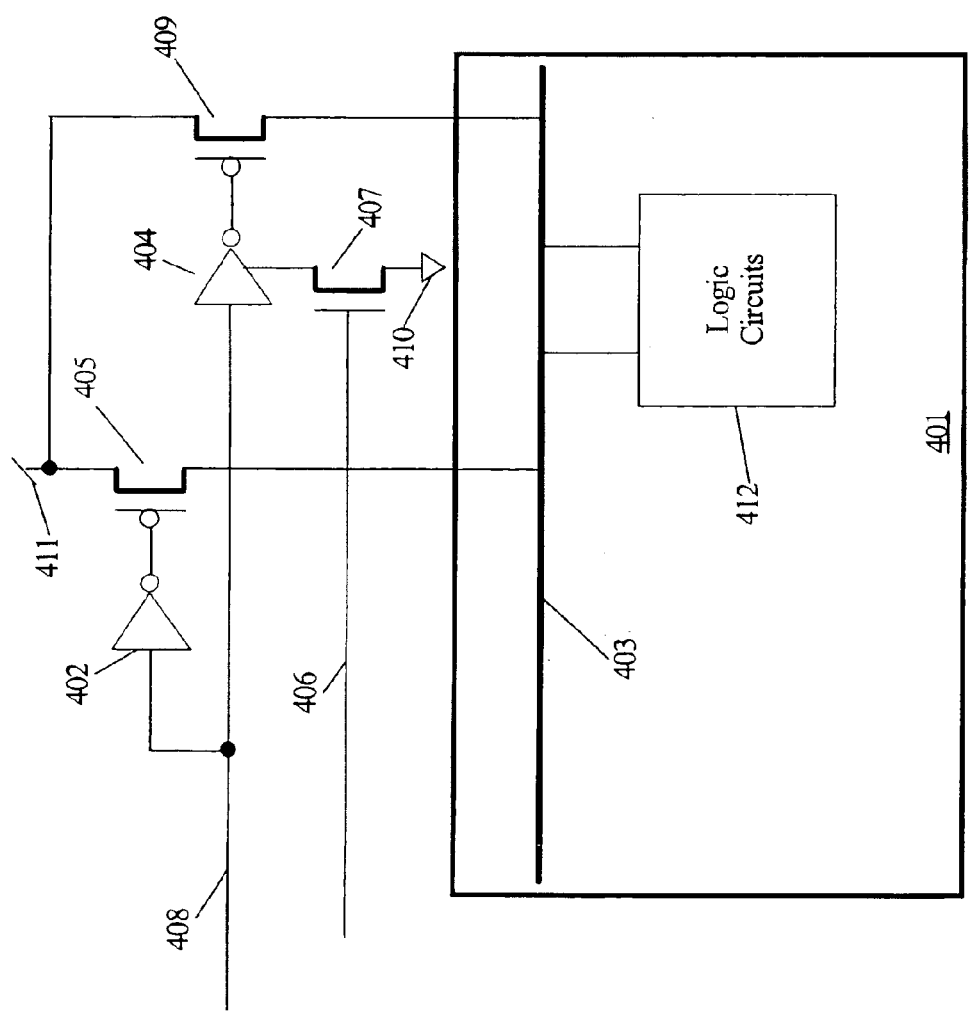
FIG. 4 is a circuit block diagram illustrating a basic topology of embodiments of the present invention adding stress gating on the high rail.

FIG. 4 is a block circuit diagram of power gating with stress relief on power gating devices to further reduce leakage according to embodiments of the present invention. When control signal 408 is a logic one, both PFET 405 and PFET 409 are turned ON via inverter 402 and power-gated inverter 404, respectively, thereby coupling actual power supply potential 411 to VPR 403 of logic circuits 412. When control signal 408 is a logic zero, both PFET 405 and PFET 409 are gated OFF. The circuit topology of FIG. 4 allows an additional level of control with control signal 406. Power-gated inverter 404 turns ON PFET 409 by providing a logic zero level from ground power supply potential 410 via NFET 407. When PFET 409 is ON, both its gate-to-drain and its gate-to-source experience maximum voltage potential and thus PFET 409 is in strong inversion with the highest leakage. However, if PFET 409 is turned ON to give VPR 403 its maximum conductivity connection to low voltage potential 410, it may be "stress" relieved by gating OFF NFET 407 with a logic zero on control signal 406. This causes the gate of PFET 409 to "float" and ultimately discharge to the positive potential reducing the leakage of PFET 409.

Figure 5:
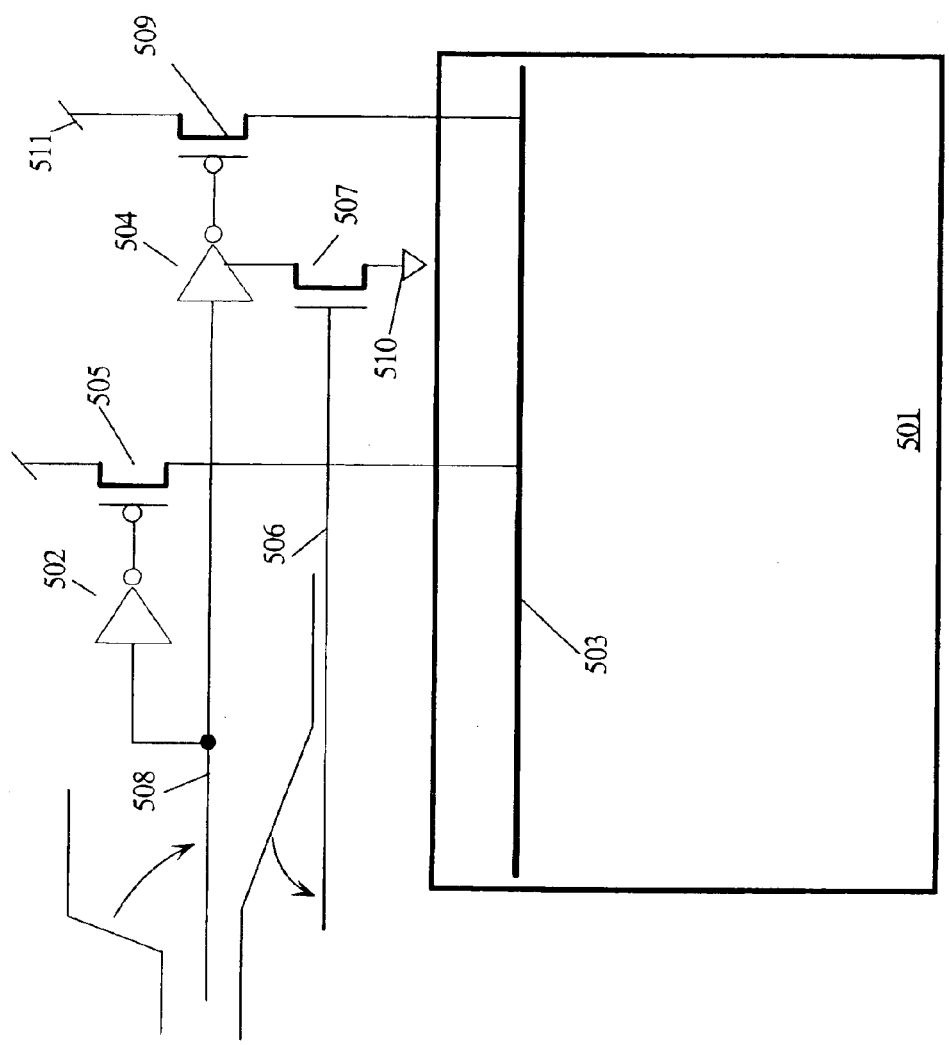
FIG. 5 is a circuit block diagram illustrating a basic topology of embodiments of the present invention illustrating timing when stress gating on the high rail.

FIG. 5 illustrates waveforms for control signals 506 and 508. Control signal 508 transitions to a logic one quickly turning ON PFETs 505 and 509 via inverter 502 and power-gated inverter 504, respectively. Control signal 506 transitions more slowly from a logic one to a logic zero. This allows positive potential 511 to be quickly coupled with its maximum conductivity to VPR 503. Control signal 566 turns OFF NFET 507 more slowly to stress relieve PFET 509 resulting in lower leakage.

Figure 6:
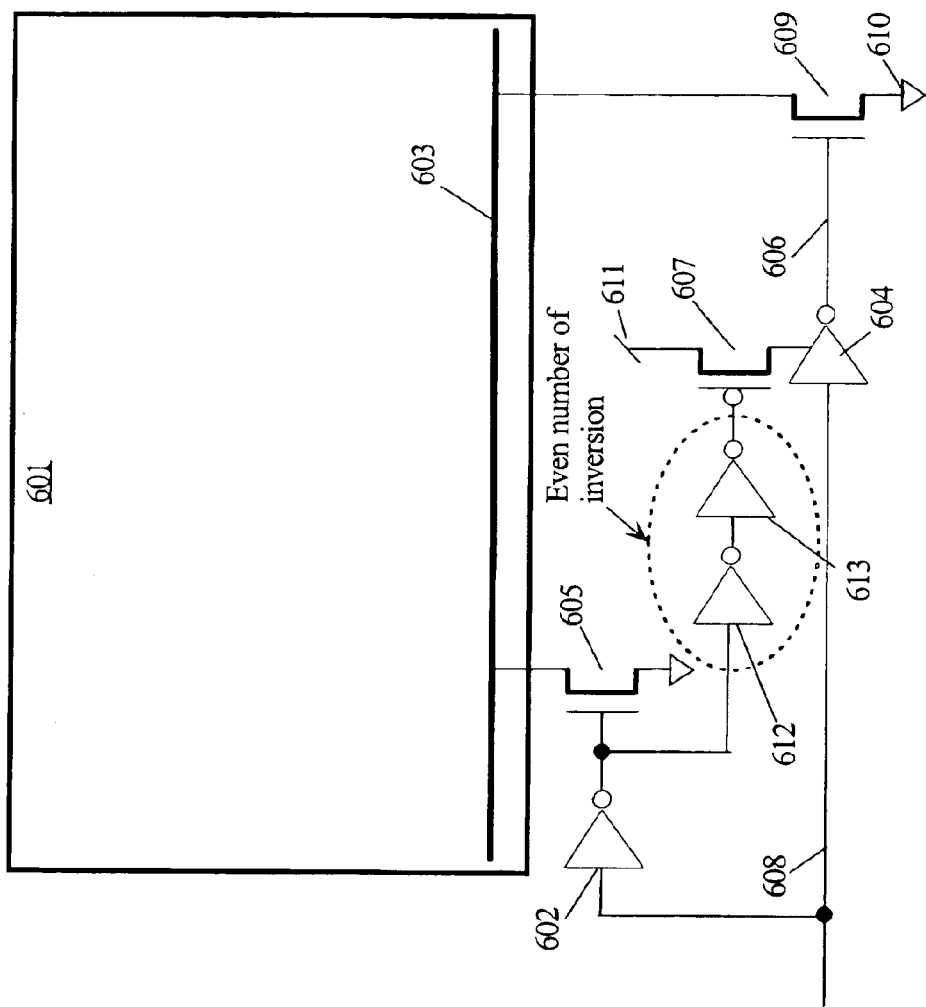
FIG. 6 is a circuit block diagram illustrating another embodiment of the present invention with stress gating on the low rail.

FIG. 6 is another embodiment of the present invention illustrating power gating on a VGR 603 in circuit domain 601. Control signal 608 is used as a single control for power gating NFETs 605 and 609. When control signal 608 is a logic one, both NFET 605 and 609 are gated OFF while PFET 607 is ON via inverters 612 and 613 enabling the coupling of positive power potential 611 to inverter 604 via PFET 607. When control signal 608 transitions to a logic zero, NFET 605 and 609 are turned ON. A predetermined time later (set by the delay of inverters 612 and 613), PFET 607 is turned OFF, causing output 606 to float to a logic zero thereby reducing the stress on NFET 609.

Figure 7:
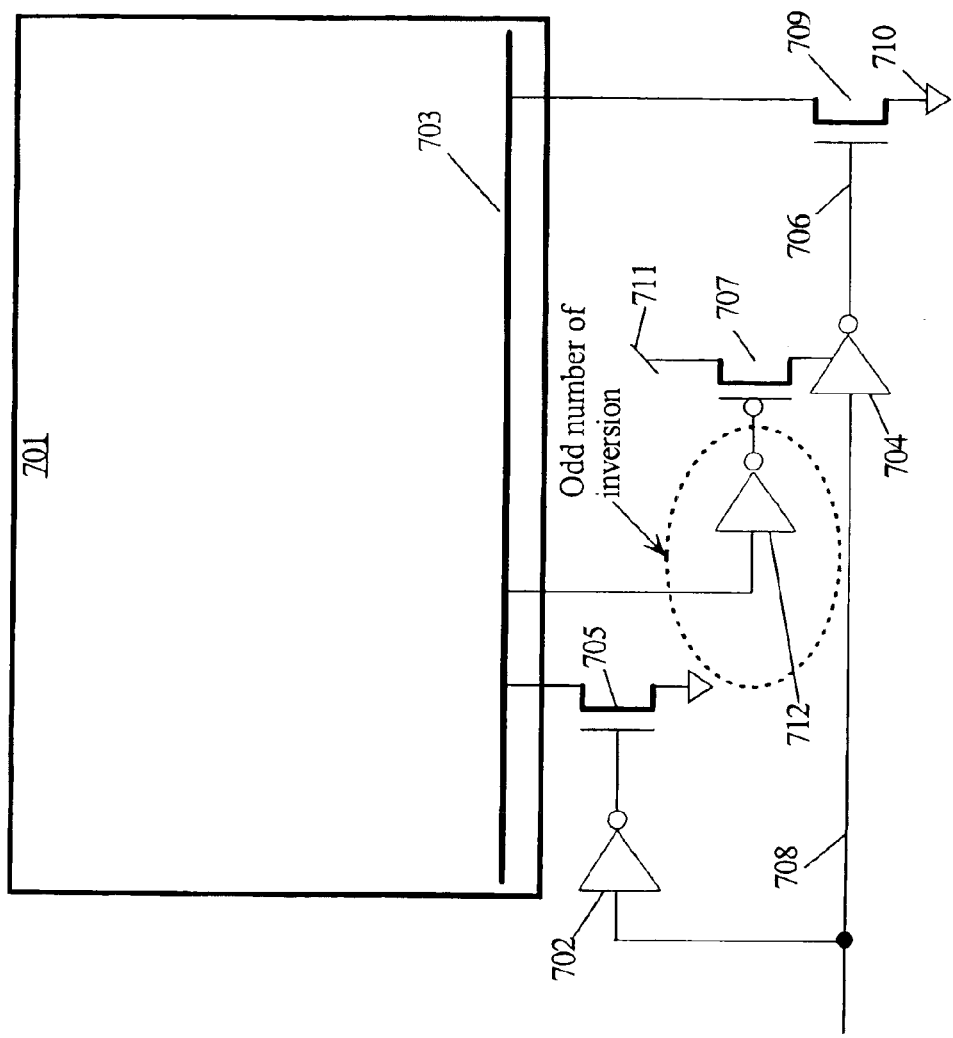
FIG. 7 is a circuit block diagram illustrating yet another embodiment of the present invention with stress gating on the low rail.

FIG. 7 is another embodiment of the present invention illustrating power gating of a VGR 703. Control signal 708 turns ON NFETs 705 and 709 via inverter 702 and power-gated inverter 704. PFET 707 is used to de-couple the positive potential 711 from power-gated inverter 704 to stress relieve NFET 709. When control 708 is a logic one, both NFET 705 and 709 are OFF and VGR 703 is decoupled from ground potential 710. After VGR 703 is pulled to the ground potential 710 (logic zero), the output of inverter 712 transitions to a logic one and turns OFF PFET 707 which causes node 706 to float to a logic zero thereby reducing the stress on NFET 709.

Figure 8:
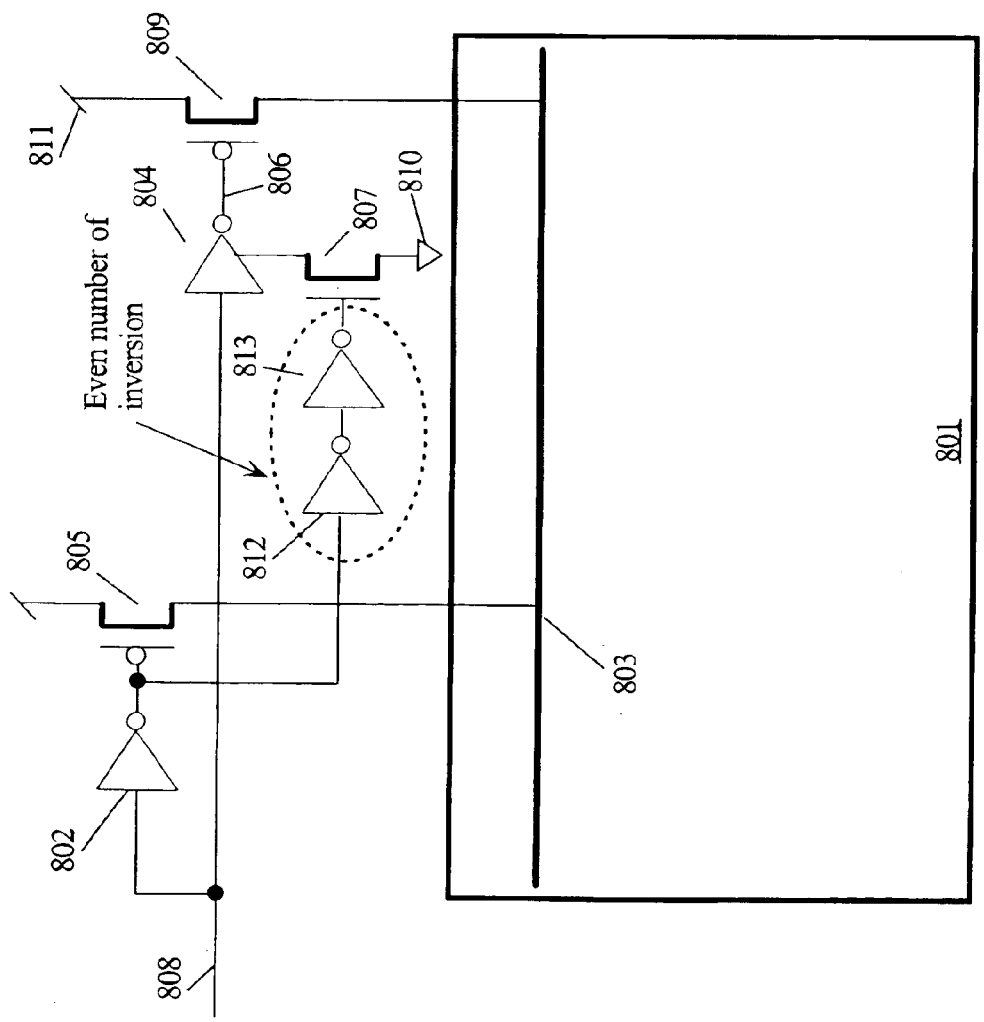
FIG. 8 is a circuit block diagram illustrating another embodiment of the present invention with stress gating on the high rail.

FIG. 8 is another embodiment of the present invention illustrating power gating on a VPR 803 in circuit domain 801. Control signal 808 is used as a single control for power gating PFETs 805 and 809. When control signal 808 is a logic zero, both PFET 805 and 809 are gated OFF while NFET 807 is gated ON coupling of the ground potential 810 to inverter 804. When control signal 808 transitions to a logic one, PFETs 805 and 809 are turned ON. A predetermined time later (set by the delay of inverters 812 and 813) NFET 807 is turned OFF causing output 806 to float to a logic one thereby reducing the stress on PFET 809.

Figure 9:
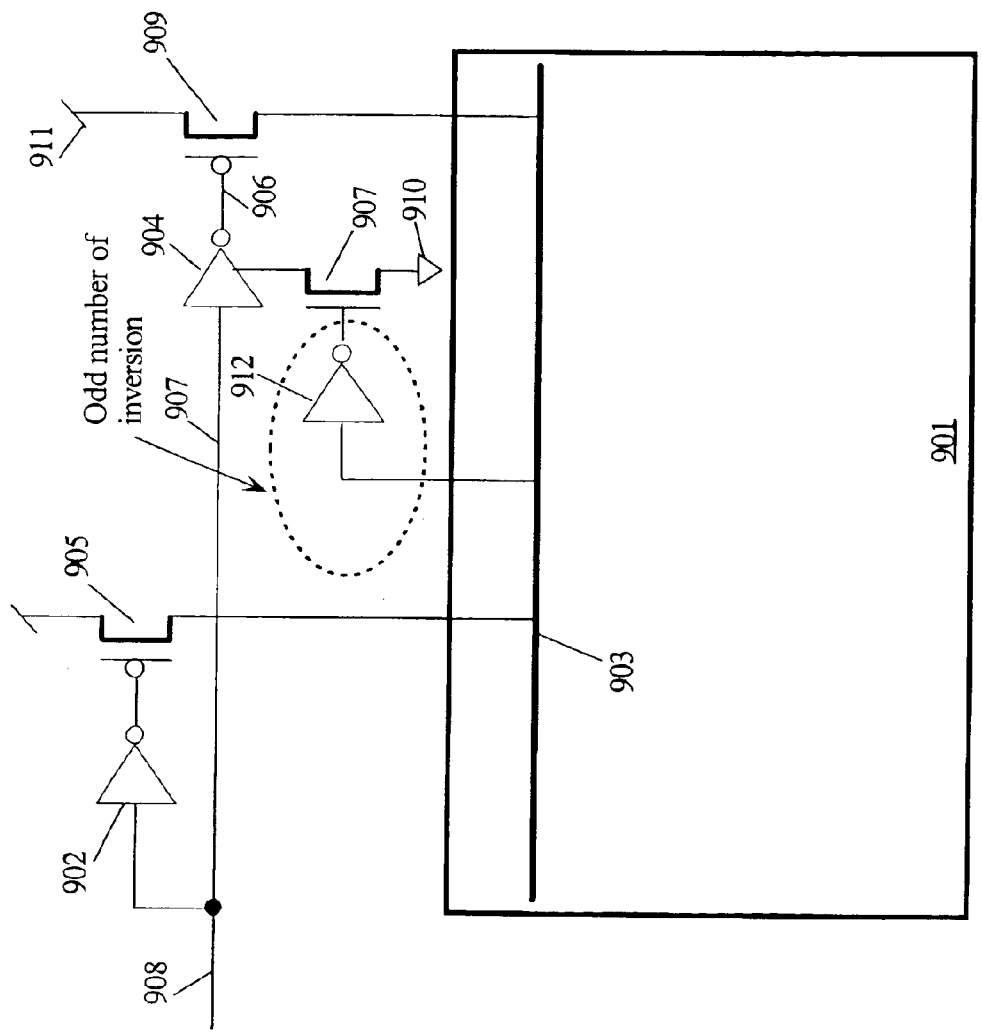
FIG. 9 is a circuit block diagram illustrating another embodiment of the present invention with stress gating on the high rail.

FIG. 9 is another embodiment of the present invention with power gating of a VPR 903. When control signal 908 is a logic one PFETs 905 and 909 are turned ON via inverter 902 and power-gated inverter 904. NFET 907 is used to de-couple the ground potential 911 from power-gated inverter 904 to stress relieve PFET 909. When control 908 is a logic zero, both PFET 905 and 909 are OFF and VPR 903 is decoupled from positive power potential 911. After VPR 903 is pulled to the positive potential 911, inverter 912 transitions to a logic zero, turns OFF NFET 907 and floats node 906, thereby reducing the stress on PFET 909.

Figure 10:
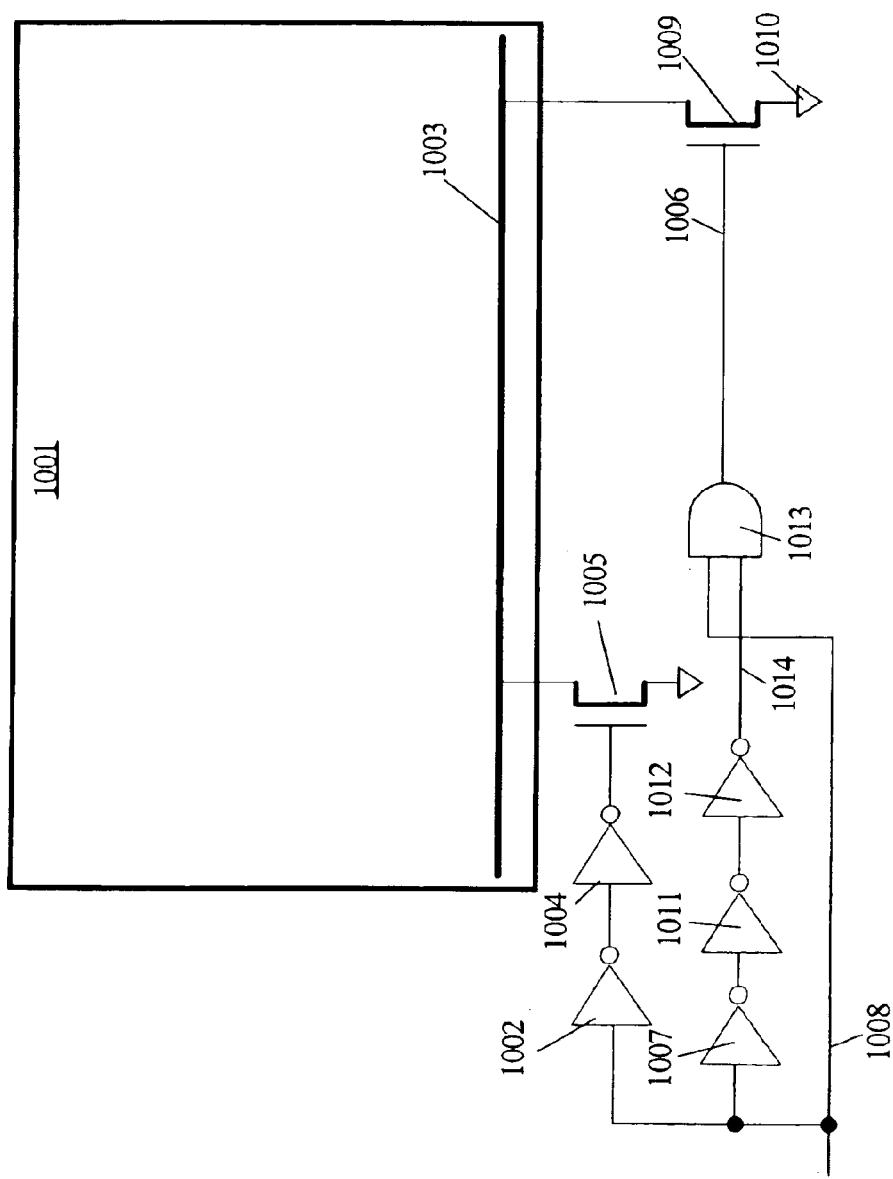
FIG. 10 is a circuit block diagram illustrating yet another embodiment of the present invention with stress gating on the low rail.

FIG. 10 is another embodiment wherein a pulse circuit is used with the power-gating for VGR 1003. NFETs 1005 and 1009 couple VGR 1003 to ground power potential 1010. When control signal 1008 is a logic zero, NFET 1005 is gated OFF with inverters 1002 and 1004 and NFET 1009 is gated OFF via AND gate 1013. When control signal 1008 transitions to a logic one, the output 1006 of AND 1013 and the output of inverter 1004 transition to a logic one turning ON both NFET 1009 and 1005. A predetermined time later (delay through inverters 1007, 1011 and 1012), the input 1014 to AND 1013 transitions to a logic zero causing AND 1013 to turn OFF NFET 1009. This pulse action removes the stress on NFET 1009 after a delay set by the delay through inverters 1007, 1011 and 1012.

Figure 11:
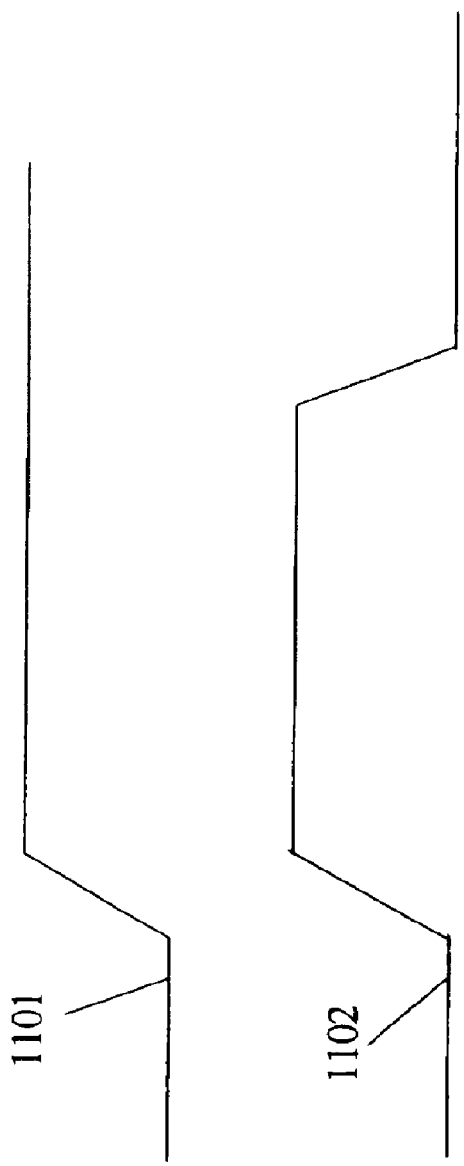
FIG. 11 is a timing diagram of signals for controlling stress gating.

FIG. 11 illustrates exemplary gating waveforms for "stay ON" and leakage stress relieved power gating branches. Waveform 1101 illustrates branches (e.g., NFET 1005 in FIG. 10) that are gated ON and then stay ON for an extended time. Waveform 1102 illustrates branches that are gated ON for a short time (e.g., NFET 1009 in FIG. 10) and then gated OFF to stress relieve devices (e.g., NFET 1009).

Figure 12:
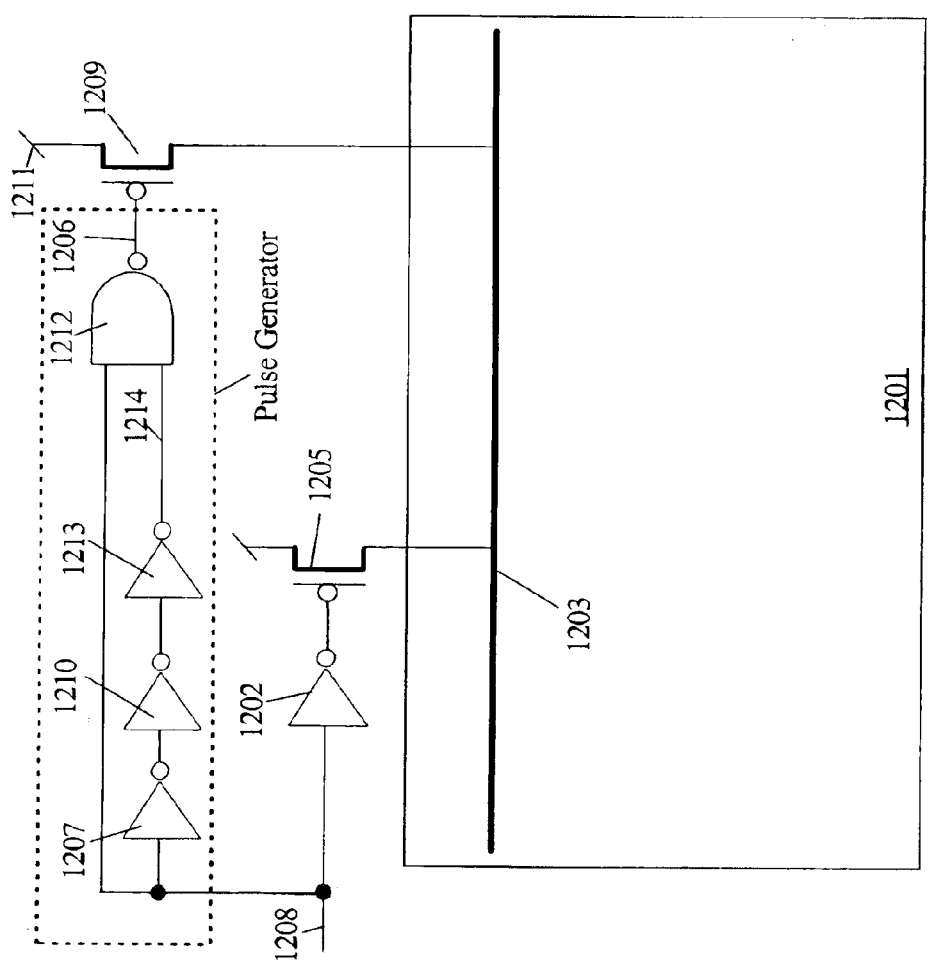
FIG. 12 is a circuit block diagram illustrating another embodiment of the present invention with stress gating on the high rail.

FIG. 12 is another embodiment wherein a pulse circuit is used with the power gating for VPR 1203. PFETs 1205 and 1209 couple VPR 1203 to positive power potential power rail 1211. When control signal 1208 is a logic one PFET 1205 is gated OFF with inverter 1202 and PFET 1209 is gated OFF via NAND gate 1212. When control signal 1208 transitions to a logic one, the output 1206 of NAND 1212 and the output of inverter 1202 transition to a logic zero turning ON both PFETs 1209 and 1205. A predetermined time later (delay through inverters 1207, 1210 and 1213), the input 1214 to NAND 1212 transitions to a logic zero causing NAND 1212 to turn OFF PFET 1209. This pulse action removes the leakage stress on PFET 1209 after a delay set by the delay through inverters 1207, 1210 and 1213.

Figure 13:
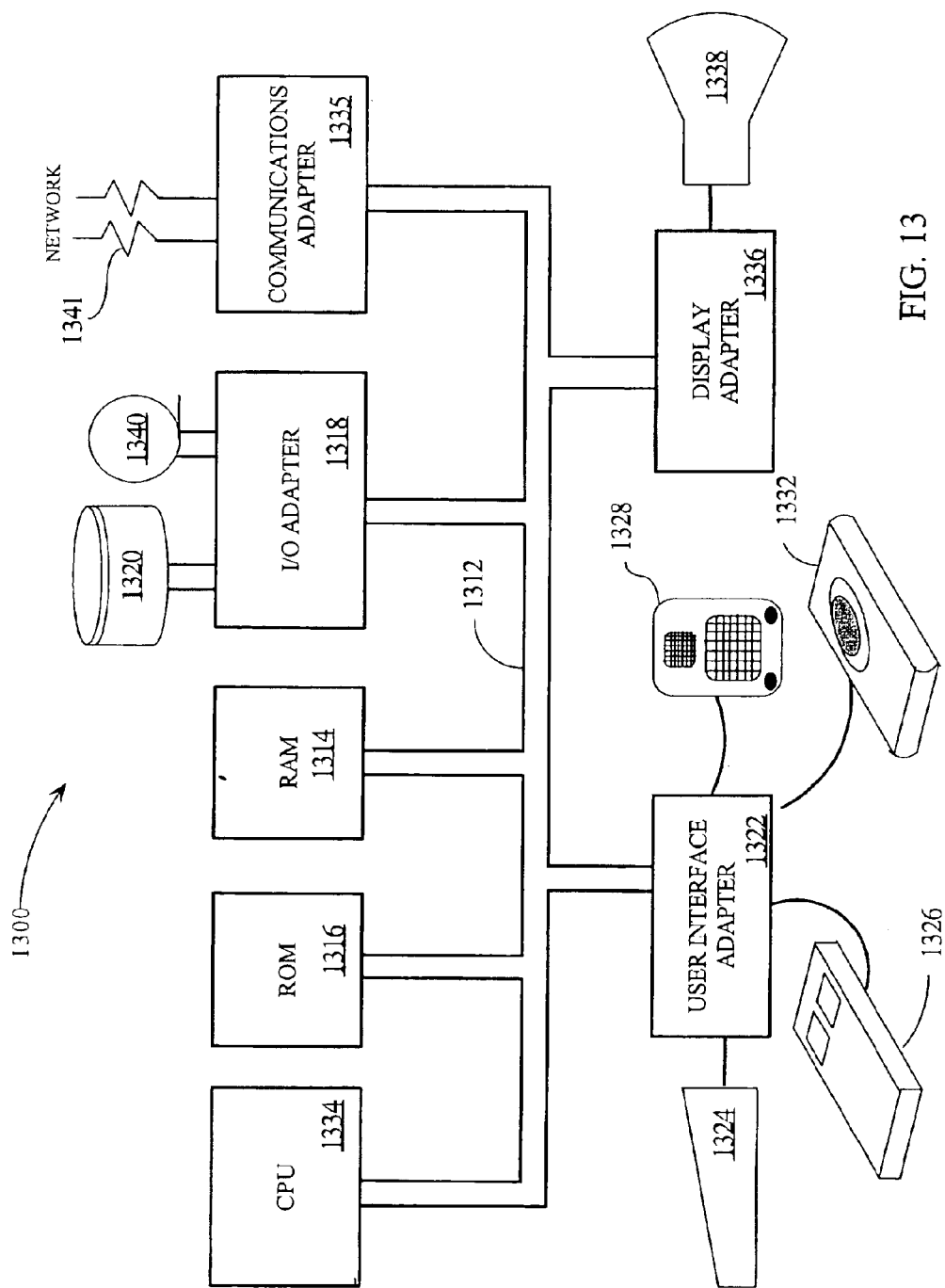
FIG. 13 is a block diagram of a data processing system suitable for practicing embodiments of the present invention.

FIG. 13 is a high level functional block diagram of a representative data processing system 1300 suitable for practicing the principles of the present invention. Data processing system 1300 includes a central processing system (CPU) 1310 operating in conjunction with a system bus 1312. System bus 1312 operates in accordance with a standard bus protocol, such as the ISA protocol, compatible with CPU 1310. CPU 1310 operates in conjunction with electronically erasable programmable read-only memory (EEPROM) 1316 and random access memory (RAM) 1314. Among other things, EEPROM 1316 supports storage of the Basic Input Output System (BIOS) data and recovery code. RAM 1314 includes DRAM (Dynamic Random Access Memory) system memory and SRAM (Static Random Access Memory) external cache. I/O Adapter 1318 allows for an interconnection between the devices on system bus 1312 and external peripherals, such as mass storage devices (e.g., a hard drive, floppy drive or CD/ROM drive), or a printer 1340. A peripheral device 1320 is, for example, coupled to a peripheral control interface (PCI) bus, and I/O adapter 1318 therefore may be a PCI bus bridge. User interface adapter 1322 couples various user input devices, such as a keyboard 1324 or mouse 1326 to the processing devices on bus 1312. Display 1338 which may be, for example, a cathode ray tube (CRT), liquid crystal display (LCD) or similar conventional display units. Display adapter 1336 may include, among other things, a conventional display controller and frame buffer memory. Data processing system 1300 may be selectively coupled to a computer or telecommunications network 1341 through communications adapter 1334. Communications adapter 1334 may include, for example, a modem for connection to a telecom network and/or hardware and software for connecting to a computer network such as a local area network (LAN) or a wide area network (WAN). CPU 1310 and other components of data processing system 1300 may contain circuitry for managing leakage current according to embodiments of the present invention.

What is claimed is:

1. Circuitry for managing leakage current in selected logic devices comprising:

a first power bus for coupling a first voltage potential of a power supply to the selected logic devices within a logic domain;

a first switch device with a first leakage current having a first node coupled to the first voltage potential and a second node coupled to the first power bus, wherein the first voltage potential is coupled to the first power bus with a first conductivity in response to a first logic state of a first control signal and decoupled from the first power bus in response to a second logic state of the first control signal; and a second switch device with a second leakage current materially greater than the first leakage current having a first node coupled to the first voltage potential and a second power node coupled to the first power bus, wherein the first voltage potential is coupled to the first power bus with a second conductivity in response to a first logic state of a second control signal and decoupled from the first power bus in response to a second logic state of the second control signal so that the first logic state of the second control signal has a materially shorter duration than the first logic state of the first control signal.

2. The circuitry of claim 1, wherein the first and second control signals concurrently generate the first logic state when the selected logic circuits are changing logic states and the first and second control signals transition to the second logic state at predetermined time intervals to manage leakage current when the selected logic circuits are holding logic states.

3. The circuitry of claim 1 further comprising:

a second power bus for coupling a second voltage potential of the power supply to the selected logic gates;

a third switch device with a third leakage current having a first node coupled to the second voltage potential and a second node coupled to the second power bus, wherein the second voltage potential is coupled to the second power bus with a first conductivity in response to the second logic state of a third control signal and decoupled from the second power bus in response to the first logic state of the third control signal; and a fourth electronic switch with a fourth leakage current materially greater than the third leakage current having a first node coupled to the second voltage potential and a second node coupled to the second power bus, wherein the second voltage potential is coupled to the second power bus with the second conductivity in response to the second logic state of a fourth control signal and decoupled from the second power bus in response to the first logic state of the fourth control signal so that the first logic state of the fourth control signal has a materially shorter duration that the first logic state of the third control signal.

4. The circuitry of claim 3, wherein the third and fourth control signals concurrently generate the second logic state when the selected logic circuits are changing logic states and the third and fourth control signals transition to the first logic state at predetermined time intervals to manage leakage current when the selected logic circuits are holding logic states.

5. The circuitry of claim 1, wherein the first control signal is generated as the output of a first power-gated logic gate in response to a first leakage control signal and the second voltage potential of the power supply is coupled to the first power-gated logic gate in response to the second logic state of a first cut-control signal and decoupled from the first power-gated logic gate in response to the first logic state of the first cut-control signal.

6. The circuitry of claim 3, wherein the third control signal is generated as the output of a second power-gated logic gate in response to a second leakage control signal and the first voltage potential of the power supply is coupled to the second power-gated logic gate in response to the first logic state of a second cut-control signal and decoupled from the second power-gated logic gate in response to the second logic state of the second cut-control signal.

7. The circuitry of claim 5, wherein the second control signal is generated as the output of a first logic gate in response to the first leakage control signal.

8. The circuitry of claim 6, wherein the fourth control signal is generated as the output of a second logic gate in response to the second leakage control signal.

9. The circuitry of claim 5, wherein the first cut-control signal is generated as the output of a third logic gate in response to the first leakage control signal.

10. The circuitry of claim 6, wherein the second cut-control signal is generated as the output of a fourth logic gate in response to the second leakage control signal.

11. The circuitry of claim 5, wherein the first cut-control signal is generated as the output of a third logic gate in response to a voltage potential of the first power bus.

12. The circuitry of claim 6, wherein the second cut-control signal is generated as the output of a fourth logic gate in response to a voltage potential of the second power bus.

13. The circuitry of claim 1, wherein the first control signal is generated as a logic combination of the second control signal and a logic inversion of the second control signal delayed by a predetermined time period.

14. The circuitry of claim 3, wherein the third control signal is generated as the logic combination of a logic inversion of the fourth control signal and the fourth control signal delayed by a predetermined time period.

15. A data processing system having a central processing unit (CPU) with circuitry for managing leakage current in selected logic devices including a first power bus for coupling a first voltage potential of a power supply to the selected logic devices within a logic domain powered by the power supply, a first switch device with a first leakage current having a first node coupled to the first voltage potential and a second node coupled to the first power bus, wherein the first voltage potential is coupled to the first power bus with a first conductivity in response to a first logic state of a first control signal and decoupled from the first power bus in response to a second logic state of the first control signal, and a second switch device with a second leakage current materially greater than the first leakage current having a first node coupled to the first voltage potential and a second power node coupled to the first power bus, wherein the first voltage potential is coupled to the first power bus with a second conductivity in response to a first logic state of a second control signal and decoupled from the first power bus in response to a second logic state of the second control signal so that the first logic state of the second control signal has a materially shorter duration than the first logic state of the first control signal.

16. The data processing system of claim 15, wherein the first and second control signals concurrently generate the first logic state when the selected logic circuits are changing logic states and the first and second control signals transition to the second logic state at predetermined time intervals to manage leakage current when the selected logic circuits are holding logic states.

17. The data processing system of claim 15 further comprising:
a second power bus for coupling a second voltage potential of the power supply to the selected logic gates;
a third switch device with a third leakage current having a first node coupled to the second voltage potential and a second node coupled to the second power bus, wherein the second voltage potential is coupled to the second power bus with a first conductivity in response to the second logic state of a third control signal and decoupled from the second power bus in response to the first logic state of the third control signal; and
a fourth electronic switch with a fourth leakage current materially greater than the third leakage current having a first node coupled to the second voltage potential and a second node coupled to the second power bus, wherein the second voltage potential is coupled to the second power bus with the second conductivity in response to the second logic state of a fourth control signal and decoupled from the second power bus in response to the first logic state of the fourth control signal so that the first logic state of the fourth control signal has a materially shorter duration that the first logic state of the third control signal.

18. The data processing system of claim 17, wherein the third and fourth control signals concurrently generate the second logic state when the selected logic circuits are changing logic states and the third and fourth control signals transition to the first logic state at predetermined time intervals to manage leakage current when the selected logic circuits are holding logic states.

19. The data processing system of claim 15, wherein the first control signal is generated as the output of a first power-gated logic gate in response to a first leakage control signal and the second voltage potential of the power supply is coupled to the first power-gated logic gate in response to the second logic state of a first cut-control signal and decoupled from the first power-gated logic gate in response to the first logic state of the first cut-control signal.

20. The data processing system of claim 17, wherein the third control signal is generated as the output of a second power-gated logic gate in response to a second leakage control signal and the first voltage potential of the power supply is coupled to the second power-gated logic gate in response to the first logic state of a second cut-control signal and decoupled from the second power-gated logic gate in response to the second logic state of the second cut-control signal.

21. The data processing system of claim 19, wherein the second control signal is generated as the output of a first logic gate in response to the first leakage control signal.

22. The data processing system of claim 20, wherein the fourth control signal is generated as the output of a second logic gate in response to the second leakage control signal.

23. The data processing system of claim 19, wherein the first cut-control signal is generated as the output of a third logic gate in response to the first leakage control signal.

24. The data processing system of claim 20, wherein the second cut-control signal is generated as the output of a fourth logic gate in response to the second leakage control signal.

25. The data processing system of claim 19, wherein the first cut-control signal is generated as the output of a third logic gate in response to a voltage potential of the first power bus.

26. The data processing system of claim 20, wherein the second cut-control signal is generated as the output of a fourth logic gate in response to a voltage potential of the second power bus.

27. The data processing system of claim 15, wherein the first control signal is generated as a logic combination of the second control signal and a logic inversion of the second control signal delayed by a predetermined time period.

28. The data processing system of claim 17, wherein the third control signal is generated as the logic combination of a logic inversion of the fourth control signal and the fourth control signal delayed by a predetermined time period.

* * * * *